United States Patent
Kim et al.

(10) Patent No.: US 7,443,037 B2
(45) Date of Patent: Oct. 28, 2008

(54) STACKED INTEGRATED CIRCUIT PACKAGE SYSTEM WITH CONNECTION PROTECTION

(75) Inventors: Hyun Joung Kim, Gyeong-do (KR); Jong Wook Ju, Bubaleub Icheon (KR); Taeg Ki Lim, Cheongju-si (KR)

(73) Assignee: Stats Chippac Ltd., Singapore (SG)

( * ) Notice: Subject to any disclaimer, the term of this patent is extended or adjusted under 35 U.S.C. 154(b) by 311 days.

(21) Appl. No.: 11/278,421

(22) Filed: Apr. 1, 2006

(65) Prior Publication Data
US 2007/0229107 A1   Oct. 4, 2007

(51) Int. Cl.
H01L 23/52    (2006.01)
H01L 23/48    (2006.01)
H01L 29/40    (2006.01)

(52) U.S. Cl. .............. 257/777; 257/E27.137; 257/685; 257/686; 257/723; 438/108; 438/109; 361/760

(58) Field of Classification Search .......... 257/E27.137, 257/E27.144, E27.161, 685, 686, 777, 723, 257/724; 324/765; 438/108, 109; 361/760
See application file for complete search history.

(56) References Cited

U.S. PATENT DOCUMENTS

| | | | |
|---|---|---|---|
| 5,323,060 A | 6/1994 | Fogal et al. | |
| 6,271,598 B1 * | 8/2001 | Vindasius et al. | 257/777 |
| 6,333,562 B1 * | 12/2001 | Lin | 257/777 |
| 6,388,313 B1 | 5/2002 | Lee et al. | |
| 6,441,496 B1 * | 8/2002 | Chen et al. | 257/777 |
| 6,472,758 B1 | 10/2002 | Glenn et al. | |
| 6,531,784 B1 * | 3/2003 | Shim et al. | 257/777 |
| 6,569,709 B2 | 5/2003 | Derderian | |
| 6,593,662 B1 * | 7/2003 | Pu et al. | 257/777 |
| 6,657,290 B2 | 12/2003 | Fukui et al. | |
| 6,710,455 B2 * | 3/2004 | Goller et al. | 257/777 |
| 6,753,613 B2 * | 6/2004 | Levardo et al. | 257/780 |
| 6,885,093 B2 * | 4/2005 | Lo et al. | 257/686 |
| 6,897,088 B2 * | 5/2005 | Hedler et al. | 438/102 |
| 6,919,627 B2 * | 7/2005 | Liu et al. | 257/686 |
| 6,977,439 B2 | 12/2005 | Kang et al. | |
| 7,037,756 B1 * | 5/2006 | Jiang et al. | 438/109 |
| 7,078,264 B2 * | 7/2006 | Yang | 438/108 |
| 7,166,924 B2 * | 1/2007 | Lu et al. | 257/777 |
| 7,268,418 B2 * | 9/2007 | Wang | 257/686 |
| 2002/0125556 A1 * | 9/2002 | Oh et al. | 257/685 |
| 2003/0038357 A1 * | 2/2003 | Derderian | 257/686 |
| 2004/0084760 A1 * | 5/2004 | Liu et al. | 257/686 |

\* cited by examiner

*Primary Examiner*—Chris C. Chu
(74) *Attorney, Agent, or Firm*—Mikio Ishimaru

(57) ABSTRACT

A stacked integrated circuit package system is provided connecting an interconnect between a first integrated circuit device and a substrate, the first integrated circuit device on the substrate, applying a protective dot on the first integrated circuit device, mounting a second integrated circuit device, having an adhesive, on the protective dot, with the adhesive on the first integrated circuit device, connecting the second integrated circuit device and the substrate, and encapsulating the first integrated circuit device, the second integrated circuit device, and the interconnect.

20 Claims, 6 Drawing Sheets

STACKED INTEGRATED CIRCUIT PACKAGE SYSTEM WITH CONNECTION PROTECTION

TECHNICAL FIELD

The present invention relates generally to integrated circuit packages and more particularly to stacked integrated circuit packages.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

Thus, a need still remains for a stacked integrated circuit package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package system including connecting an interconnect between a first integrated circuit device and a substrate, the first integrated circuit device on the substrate, applying a protective dot on the first integrated circuit device, mounting a second integrated circuit device, having an adhesive, on the protective dot, with the adhesive on the first integrated circuit device, connecting the second integrated circuit device and the substrate, and encapsulating the first integrated circuit device, the second integrated circuit device, and the interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
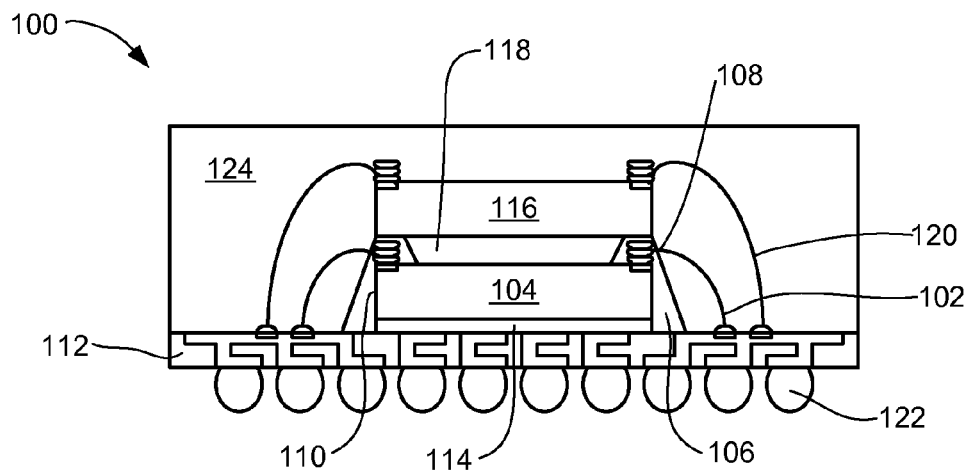
FIG. 1 is a cross-sectional view of a stacked integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a stacked integrated circuit package system 100 in an embodiment of the present invention. The stacked integrated circuit package system 100 provides a protection system for first interconnects 102, such as a reverse stitch standoff bump (RSSB) wire, ribbon bond wire, or bond wire, on a first integrated circuit device 104, such as an integrated circuit die or an integrated circuit package system, in the stack configuration. The integrated circuit package system is a packaged integrated circuit or circuits.

Protective dots 106, such as an epoxy or a B-stage material, support wire necks 108 of the first interconnects 102 on the first integrated circuit device 104 protecting the wire necks 108 from fracture or bond connection separation withstanding a stacking process. The protective dots 106 also flow to sides 110 of the first integrated circuit device 104 next to the wire necks 108 providing additional support to the first interconnects 102 minimizing wire sweep to withstand the molding process.

The first integrated circuit device 104 attaches on a substrate 112, such as a two layer inorganic substrate, with a first adhesive 114, such as a die-attach adhesive. The first interconnects 102 connect between the first integrated circuit device 104 and the substrate 112. A second integrated circuit device 116, such as an integrated circuit die or an integrated circuit package system, stacks on the first integrated circuit device 104 with a stacking adhesive 118. The protective dots 106 also serve as spacers between the first integrated circuit device 104 and the second integrated circuit device 116 with the stacking adhesive 118 surrounding the protective dots 106.

Second interconnects 120, such as a reverse stitch standoff bump (RSSB), ribbon bond wire, or bond wire, connect between the second integrated circuit device 116 and the substrate 112. External interconnects 122, such as solder balls, attach to the substrate 112 on an opposite side to the first integrated circuit device 104. An encapsulation 124, such as an epoxy mold compound, covers the first integrated circuit device 104, the second integrated circuit device 116, the first interconnects 102, and the second interconnects 120.

The protective dots 106 eliminate or minimize fractures or bond separations of the first interconnects 102 on the first integrated circuit device 104 stacked below the second integrated circuit device 116 improving manufacturing yield and reliability subsequently lowering the overall cost of the package. Wire sweeps are eliminated or reduced with the protective dots 106 at the sides of the first integrated circuit device 104 protecting portions of the first interconnects 102 next to the wire necks 108 further improving manufacturing yield and reliability subsequently lowering the overall cost of the package. The protective dots 106 also allow thinner bondline thickness (BLT) improving reliability of lower loop height bonding methods, such as RSSB or ribbon bonding, resulting in a lower package height. Further, the protective dots 106 may also be used to increase reliability of high stitch standoff height.

For illustrative purpose, the protective dots 106 are shown between stacked devices, although it is understood that the protective dots 106 may also be used on non-stacked devices or devices on top of a stack. Also for illustrative purpose, the protective dots 106 are applied on the devices, although it is understood that the protective dots 106 may also be applied at the other end of the interconnects, such as on the substrate. Further for illustrative purpose, the protective dots 106 are described as dots, although it is understood that the protective dots 106 may be in different configuration or geometric shape, such as a film, tape, or patterned.

Figure 2:
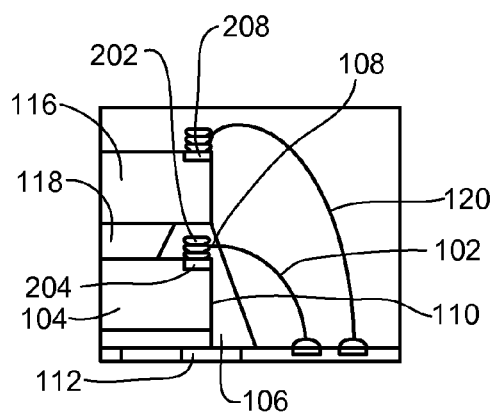
FIG. 2 is a more detailed cross-sectional view of the interconnect configuration of FIG. 1.

Referring now to FIG. 2, therein is shown a more detailed cross-sectional view of the interconnect configuration of FIG. 1. The first interconnects 102 connect to stitch ball stacks 202 on first peripheral bond pads 204 of the first integrated circuit device 104. The protective dots 106 covers and protects the stitch ball stacks 202 as well as the wire necks 108 next to the stitch ball stacks 202. The portion of the protective dots 106 along the sides 110 of the first integrated circuit device 104 also covers and protects other portions of the first interconnects 102 next to the stitch ball stacks 202. The protective dots 106 touch the second integrated circuit device 116 serving as spacers in the stack configuration. The stacking adhesive 118 surrounds the protective dots 106. The first interconnects 102 also connect to the substrate 112. The second interconnects 120 connect to second peripheral bond pads 208 of the second integrated circuit device 116.

Figure 3:
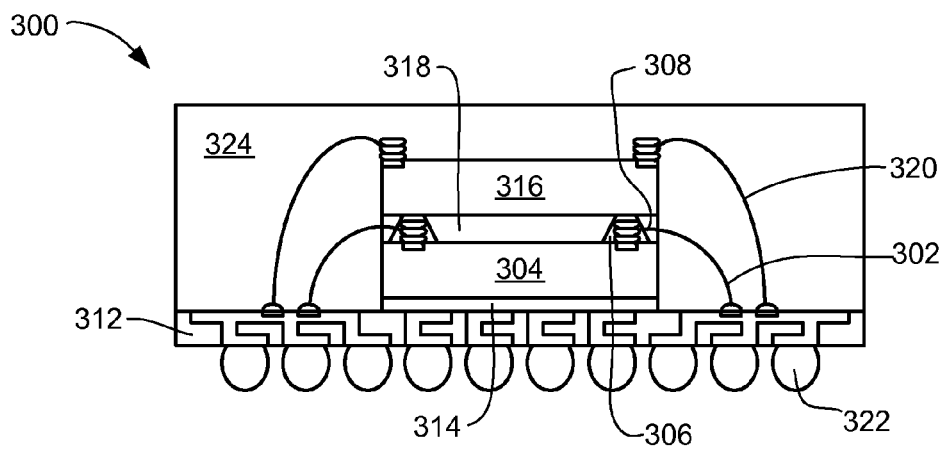
FIG. 3 is a cross-sectional view of a stacked integrated circuit package system in an alternative embodiment of the present invention.

Referring now to FIG. 3, therein is shown a cross-sectional view of a stacked integrated circuit package system 300 in an alternative embodiment of the present invention. The stacked integrated circuit package system 300 provides a protection system for first interconnects 302, such as a reverse stitch standoff bump (RSSB) wire, ribbon bond wire, or bond wire, on a first integrated circuit device 304 in the stack configuration. Protective dots 306, such as an epoxy or a B-stage material, support wire necks 308 of the first interconnects 302 on the first integrated circuit device 304 protecting the wire necks 308 withstanding a stacking process and a molding process.

The first integrated circuit device 304 attaches on a substrate with a first adhesive 314. The first interconnects 302 connect between the first integrated circuit device 304 and a substrate 312. A second integrated circuit device 316 stacks on the first integrated circuit device 304 with a stacking adhesive 318. The protective dots 306 also serve as spacers between the first integrated circuit device 304 and the second integrated circuit device 316 with the stacking adhesive 318 surrounding the protective dots 306.

Second interconnects 320 connect between the second integrated circuit device 316 and the substrate 312. External interconnects 322 attach to the substrate 312 on an opposite side to the first integrated circuit device 304. An encapsulation 324 covers the first integrated circuit device 304, the second integrated circuit device 316, the first interconnects 302, and the second interconnects 320.

For illustrative purpose, the protective dots 306 are described as dots, although it is understood that the protective dots 306 may be in different configuration or geometric shape, such as a film, tape, or patterned.

Figure 4:
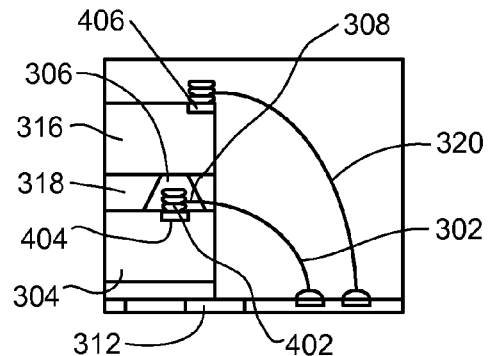
FIG. 4 is a more detailed cross-sectional view of the interconnect configuration of FIG. 3.

Referring now to FIG. 4, therein is shown a more detailed cross-sectional view of the interconnect configuration of FIG. 3. The first interconnects 302 connect to stitch ball stacks 402 on first peripheral bond pads 404 of the first integrated circuit device 304. The protective dots 306 covers and protects the stitch ball stacks 402 as well as the wire necks 308 next to the stitch ball stacks 402. The protective dots 306 touch the second integrated circuit device 316 serving as spacers in the stack configuration. The stacking adhesive 318 surrounds the protective dots 306. The first interconnects 302 also connect to the substrate 312. The second interconnects 320 connect to second peripheral bond pads 406 of the second integrated circuit device 316.

Figure 5:
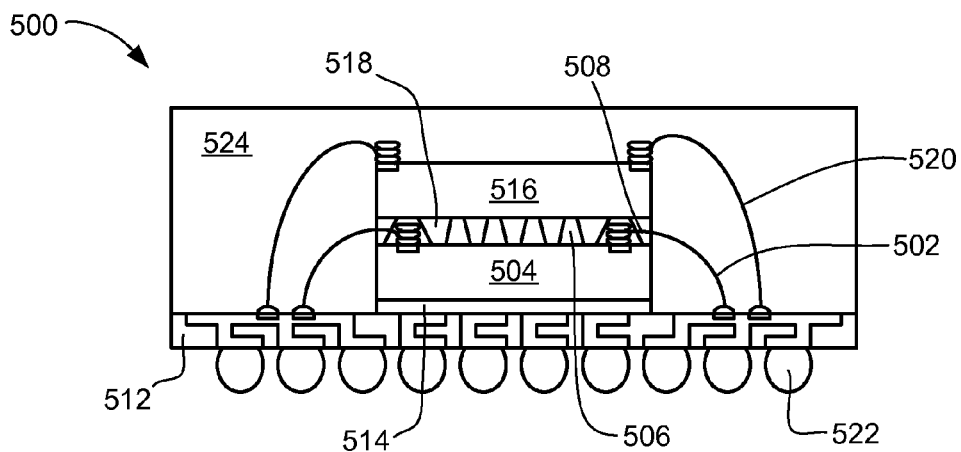
FIG. 5 is a cross-sectional view of a stacked integrated circuit package system in another alternative embodiment of the present invention.

Referring now to FIG. 5, therein is shown a cross-sectional view of a stacked integrated circuit package system 500 in another alternative embodiment of the present invention. The stacked integrated circuit package system 500 provides a protection system for first interconnects 502, such as a reverse stitch standoff bump (RSSB) wire, ribbon bond wire, or bond wire, on a first integrated circuit device 504 in the stack configuration. Protective dots 506, such as an epoxy or a B-stage material, support wire necks 508 of the first interconnects 502 on the first integrated circuit device 504 protecting the wire necks 508 withstanding a stacking process and a molding process.

The first integrated circuit device 504 attaches on a substrate with a first adhesive 514. The first interconnects 502 connect between the first integrated circuit device 504 and a substrate 512. A second integrated circuit device 516 stacks on the first integrated circuit device 504 with a stacking adhesive 518. The protective dots 506 also serve as spacers between the first integrated circuit device 504 and the second integrated circuit device 516 with the stacking adhesive 518 surrounding the protective dots 506. The protective dots 506 are distributed on the interior of the first integrated circuit device 504 distributing stacking force on the second integrated circuit device 516.

Second interconnects 520 connect between the second integrated circuit device 516 and the substrate 512. External interconnects 522 attach to the substrate 512 on an opposite side to the first integrated circuit device 504. An encapsulation 524 covers the first integrated circuit device 504, the second integrated circuit device 516, the first interconnects 502, and the second interconnects 520.

Figure 6:
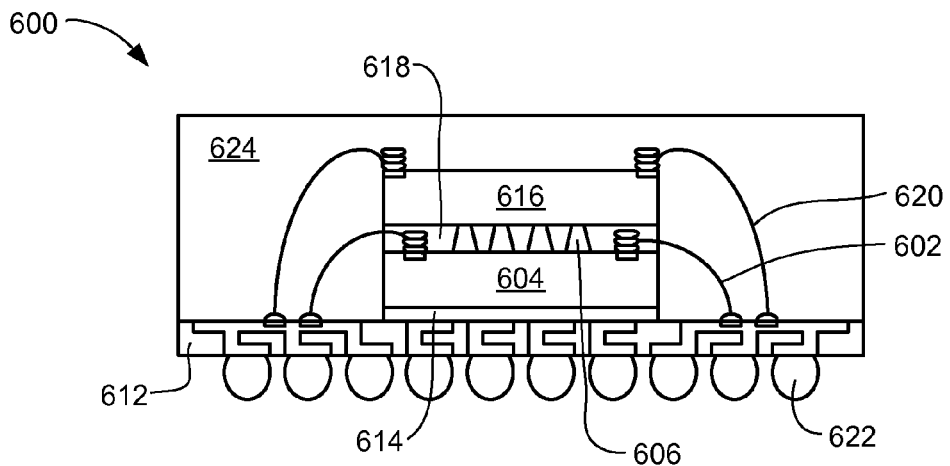
FIG. 6 is a cross-sectional view of a stacked integrated circuit package system in yet another alternative embodiment of the present invention.

Referring now to FIG. 6, therein is shown a cross-sectional view of a stacked integrated circuit package system 600 in yet another alternative embodiment of the present invention. The stacked integrated circuit package system 600 provides a protection system for first interconnects 602, such as a reverse stitch standoff bump (RSSB) wire, ribbon bond wire, or bond wire, on a first integrated circuit device 604 in the stack configuration. Protective dots 606, such as an epoxy or a B-stage material, distributed on the interior of the first integrated circuit device 604 serve as spacers between the first integrated circuit device 604 and a second integrated circuit device 616 with a stacking adhesive 618 surrounding the protective dots 606. The protective dots 606 distribute the stacking force on the second integrated circuit device 616 withstanding a stacking.

The first integrated circuit device 604 attaches on a substrate with a first adhesive 614. The first interconnects 602 connect between the first integrated circuit device 604 and a substrate 612. Second interconnects 620 connect between the second integrated circuit device 616 and the substrate 612. External interconnects 622 attach to the substrate 612 on an opposite side to the first integrated circuit device 604. An encapsulation 624 covers the first integrated circuit device 604, the second integrated circuit device 616, the first interconnects 602, and the second interconnects 620.

Figure 7:
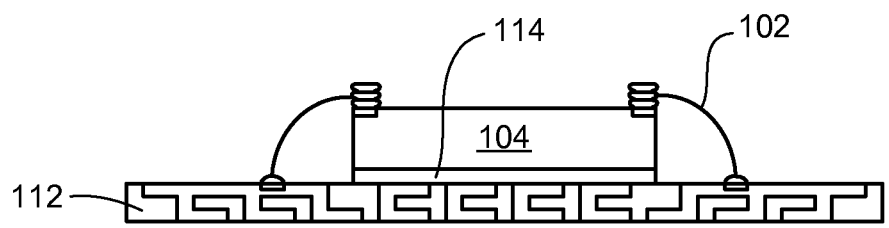
FIG. 7 is a cross-sectional view of the stacked integrated circuit package system of FIG. 1 in a first interconnect-attach phase.

Referring now to FIG. 7, therein is shown a cross-sectional view of the stacked integrated circuit package system 100 of FIG. 1 in a first interconnect-attach phase. The first integrated circuit device 104 attaches on the substrate 112 with the first adhesive 114. The first interconnects 102 connect the first peripheral bond pads of the first integrated circuit device 104 and the substrate 112.

Figure 8:
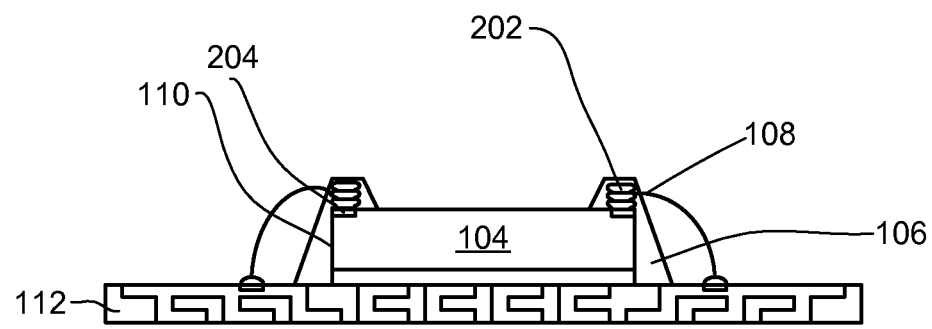
FIG. 8 is the structure of FIG. 7 in a protective application phase.

Referring now to FIG. 8, therein is shown the structure of FIG. 7 in a protective application phase. The protective dots 106 are applied on the stitch ball stacks 202 on the first peripheral bond pads 204 covering the stitch ball stacks 202, the wire necks 108, and the sides 110 of the first integrated circuit device 104. The application of the protective dots 106 does not impede or block other contact sites on the substrate 112.

Figure 9:
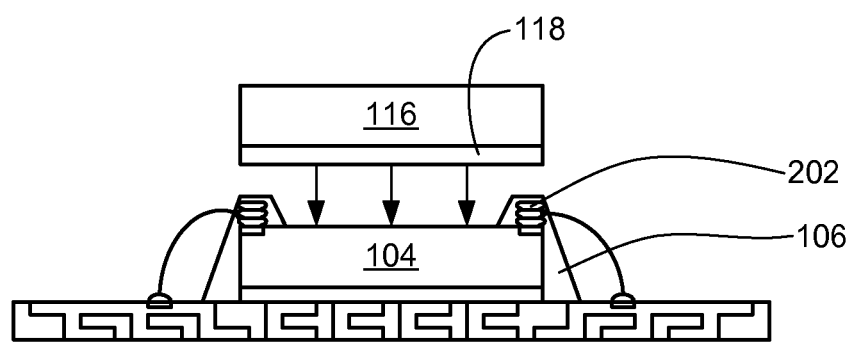
FIG. 9 is the structure of FIG. 8 in a stack phase.

Referring now to FIG. 9, therein is shown the structure of FIG. 8 in a stack phase. The stacking adhesive 118 on the second integrated circuit device 116 is partially cured to a bondline thickness (BLT) approximately to the height of the protective dots 106 covering the stitch ball stacks 202. The second integrated circuit device 116 undergoes stacking on the first integrated circuit device 104 and the protective dots 106 with the stacking adhesive 118 facing the first integrated circuit device 104.

Figure 10:
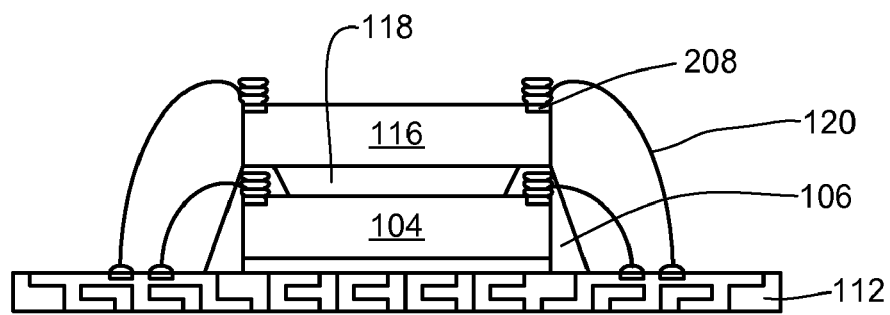
FIG. 10 is the structure of FIG. 9 in a second interconnect-attach phase.

Referring now to FIG. 10, therein is shown the structure of FIG. 9 in a second interconnect-attach phase. The second integrated circuit device 116 is stacked on the first integrated circuit device 104. The protective dots 106 surrounded by the stacking adhesive 118 serve as spacers between the two devices. The second interconnects 120 connect between the second peripheral bond pads 208 of the second integrated circuit device 116 and the substrate 112.

Figure 11:
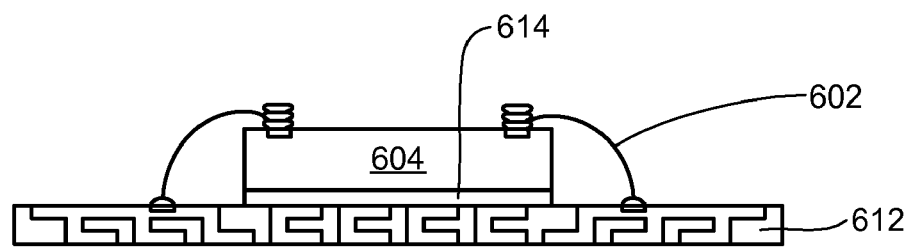
FIG. 11 is a cross-sectional view of the stacked integrated circuit package system of FIG. 6 in a first interconnect-attach phase.

Referring now to FIG. 11, therein is shown a cross-sectional view of the stacked integrated circuit package system 600 of FIG. 6 in a first interconnect-attach phase. Similar to the first interconnect-attach phase of FIG. 7, the first integrated circuit device 604 attaches on the substrate 612 with the first adhesive 614. The first interconnects 602 connect the first peripheral bond pads of the first integrated circuit device 604 and the substrate 612.

Figure 12:
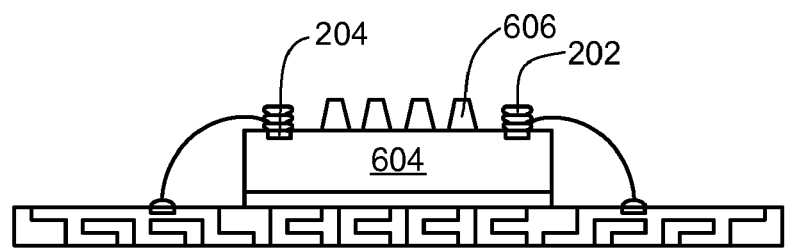
FIG. 12 is the structure of FIG. 11 in a protective application phase.

Referring now to FIG. 12, therein is shown the structure of FIG. 11 in a protective application phase. The protective dots 606 are applied on the interior of the first integrated circuit device 604 between the stitch ball stacks 202 on the first peripheral bond pads 204. The protective dots 606 are distributed to distribute stacking force.

Figure 13:
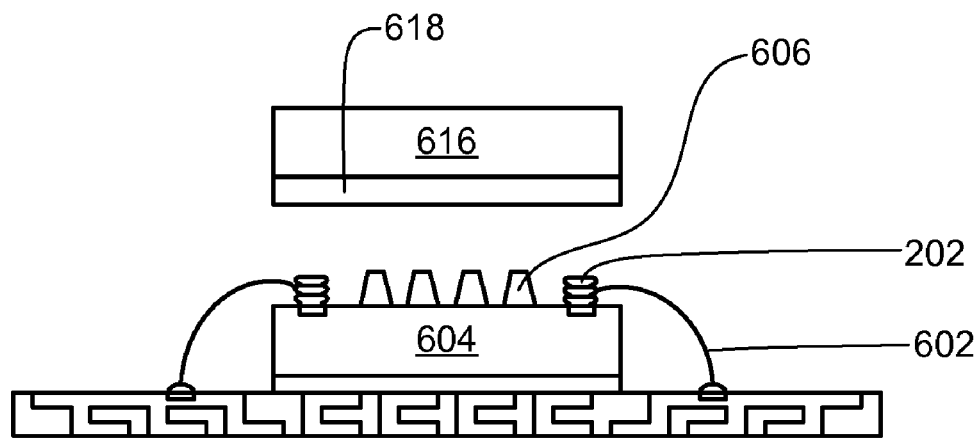
FIG. 13 is the structure of FIG. 12 in a stack phase.

Referring now to FIG. 13, therein is shown the structure of FIG. 12 in a stack phase. The stacking adhesive 618, such as an epoxy or a B-stage material, on the second integrated circuit device 616 is partially cured to a bondline thickness (BLT) approximately to the height of the stitch ball stacks 202. The second integrated circuit device 616 undergoes stacking on the first integrated circuit device 604 and the protective dots 606 with the stacking adhesive 618 facing the first integrated circuit device 604. The stacking adhesive 618 does not cause or minimize wire sweep of the first interconnects 602 during stacking.

Figure 14:
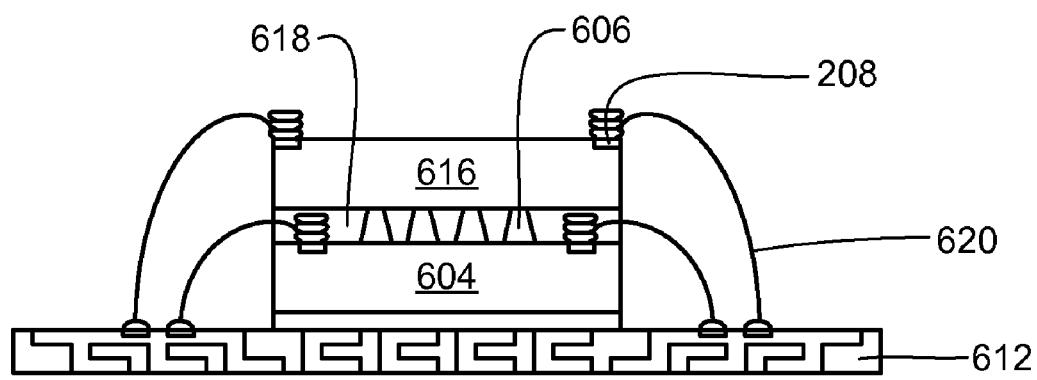
FIG. 14 is the structure of FIG. 13 in a second interconnect-attach phase.

Referring now to FIG. 14, therein is shown the structure of FIG. 13 in a second interconnect-attach phase. The second integrated circuit device 616 is stacked on the first integrated circuit device 604. The protective dots 606 surrounded by the stacking adhesive 618 serve as spacers between the two devices. The second interconnects 620 connect between the second peripheral bond pads 208 of the second integrated circuit device 616 and the substrate 612.

Figure 15:
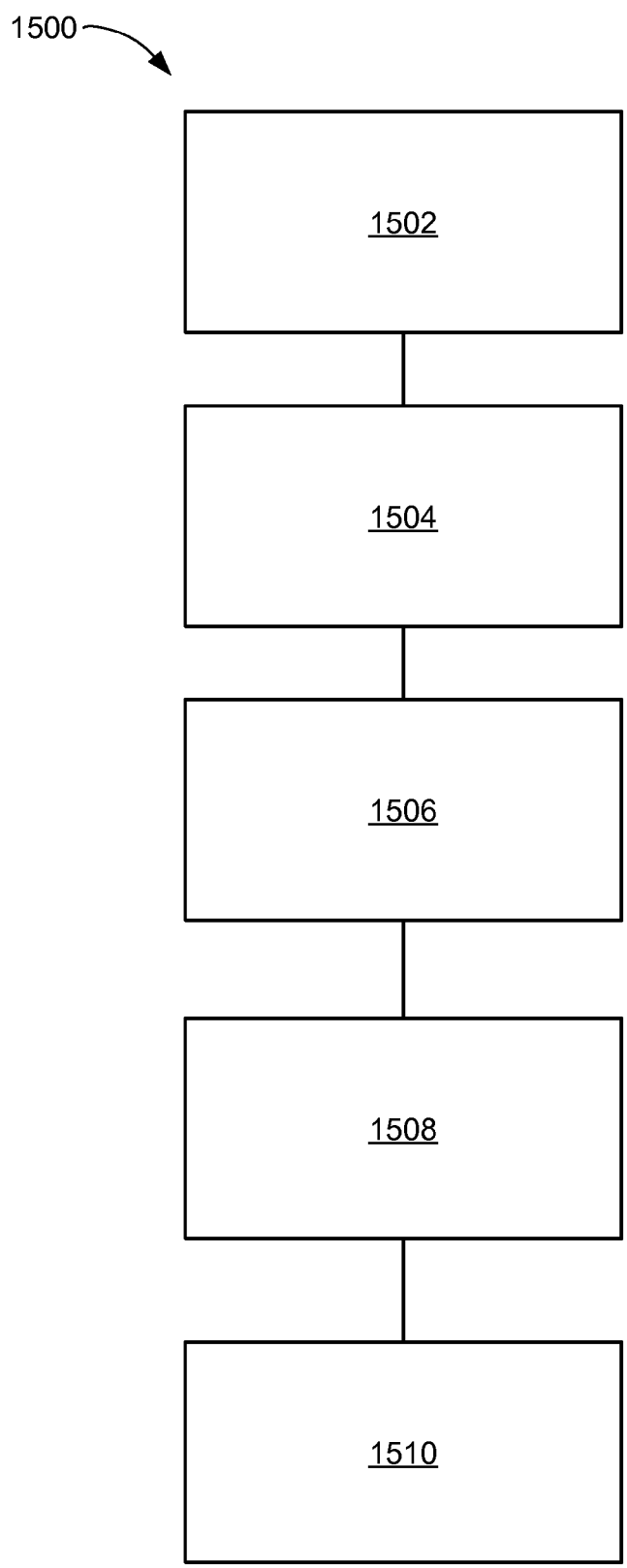
FIG. 15 is a flow chart of a stacked integrated circuit package system for manufacture of the stacked integrated circuit package system in an embodiment of the present invention.

Referring now to FIG. 15, therein is shown a flow chart of a stack integrated circuit package system 1500 for manufacture of the stacked integrated circuit package system 100 in an embodiment of the present invention. The system 1500 includes connecting an interconnect between a first integrated circuit device and a substrate, the first integrated circuit device on the substrate in a block 1502; applying a protective dot on the first integrated circuit device in a block 1504; mounting a second integrated circuit device, having an adhesive, on the protective dot, with the adhesive on the first integrated circuit device in a block 1506; connecting the second integrated circuit device and the substrate in a block 1508; and encapsulating the first integrated circuit device, the second integrated circuit device, and the interconnect in a block 1510.

It has been discovered that the present invention thus has numerous aspects.

It has been discovered that the present invention provides a protection system serving dual function as a spacer with protective dots, such as epoxy dots, between the stacked devices. The protective dots improve manufacturing yield, improve package reliability, amortize existing manufacturing equipments and materials, lowers the package height, and reduces the overall package cost.

An aspect is that the present invention provides the protective dots protecting the wires connections between the stacked integrated circuit devices preventing wire fractures and wire sweeps during stacking and molding process.

Another aspect of the present invention provides the protective dots serving a dual as spacers between the stacked integrated circuit devices. The protective dots also distribute stacking force to mitigate tilting. The BLT is minimized subsequently minimizing the package height.

Yet another aspect is that the present invention provides protective dots to protect wire connections in other locations, such as non-stacked devices, the top device on the stack, or on the substrate.

Thus, it has been discovered that the stacked integrated circuit package system method of the present invention furnishes important and heretofore unknown and unavailable solutions, capabilities, and functional aspects for improving yield and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A stacked integrated circuit package process comprising:
   connecting an interconnect between an interconnect stack on a first integrated circuit device and a substrate, the first integrated circuit device on the substrate;
   applying a protective dot around the interconnect stack on the first integrated circuit device;
   mounting a second integrated circuit device, having an adhesive, out of contact with the interconnect stack and on the protective dot, with the adhesive on the first integrated circuit device;
   connecting the second integrated circuit device and the substrate; and
   encapsulating the first integrated circuit device, the second integrated circuit device, and the interconnect.

2. The process as claimed in claim 1 wherein applying the protective dot on the first integrated circuit device includes applying the protective dot on the interconnect on the first integrated circuit device.

3. The process as claimed in claim 1 wherein applying the protective dot on the first integrated circuit device includes applying the protective dot on the interconnect on the first integrated circuit device and on a side of the first integrated circuit device next to the interconnect.

4. The process as claimed in claim 1 wherein applying the protective dot on the first integrated circuit device includes applying a plurality of protective dots on the first integrated circuit device.

5. The process as claimed in claim 1 wherein applying the protective dot on the first integrated circuit device includes applying a plurality of protective dots on the first integrated circuit device and the interconnect.

6. A stacked integrated circuit package process comprising:
   connecting an interconnect between a ball stack on a first integrated circuit device having a peripheral bond pad and a substrate, the first integrated circuit device on the substrate;
   applying a protective dot to cover the interconnect and the ball stack on the peripheral bond pad;
   mounting a second integrated circuit device, having an adhesive, out of contact with the ball stack on the protective dot, with the adhesive on the first integrated circuit device;
   connecting the second integrated circuit device and the substrate; and encapsulating the first integrated circuit device, the second integrated circuit device, and the interconnect.

7. The process as claimed in claim 6 wherein:
   connecting the interconnect comprises:
      forming the interconnect having a wire neck; and
   applying the protective dot to cover the interconnect on the peripheral bond pad further comprises:
      protecting the wire neck with the protective dot.

8. The process as claimed in claim 6 wherein connecting the interconnect between the first integrated circuit device having the peripheral bond pad and the substrate includes connecting the interconnect on the first integrated circuit device.

9. The process as claimed in claim 6 further comprising forming an additional protective dot as a spacer between the first integrated circuit device and the second integrated circuit device.

10. The process as claimed in claim 6 wherein applying the protective dot includes applying the protective dot comprised of an epoxy or a B-Stage material.

11. A stacked integrated circuit package system comprising:
   an interconnect between an interconnect stack on a first integrated circuit device and a substrate, the first integrated circuit device on the substrate;
   a protective dot around the interconnect stack on the first integrated circuit device;
   a second integrated circuit device, having an adhesive, mounted out of contact with the interconnect stack and on the protective dot, with the adhesive on the first integrated circuit device and the second integrated circuit device connected to the substrate; and
   an encapsulation to cover the first integrated circuit device, the second integrated circuit device, and the interconnect.

12. The system as claimed in claim 11 wherein the protective dot on the first integrated circuit device includes the protective dot on the interconnect on the first integrated circuit device.

13. The system as claimed in claim 11 wherein the protective dot on the first integrated circuit device includes the protective dot on the interconnect on the first integrated circuit device and on a side of the first integrated circuit device next to the interconnect.

14. The system as claimed in claim 11 wherein the protective dot on the first integrated circuit device includes a plurality of protective dots on the first integrated circuit device.

15. The system as claimed in claim 11 wherein the protective dot on the first integrated circuit device includes a plurality of protective dots on the first integrated circuit device and the interconnect.

16. The system as claimed in claim 11 wherein:

the interconnect is between the first integrated circuit device having a peripheral bond pad and the substrate, the first integrated circuit device on the substrate;

the protective dot on the first integrated circuit device is on the peripheral bond pad;

the second integrated circuit device, having the adhesive, is on the protective dot, with the adhesive on the first integrated circuit device and the protective dot covered, and the second integrated circuit device connected to the substrate;

the second integrated circuit device is connected to the substrate with a wire; and the encapsulation to cover the first integrated circuit device, the second integrated circuit device, the interconnect, and the wire.

17. The system as claimed in claim 16 wherein:

the interconnect comprises:

the interconnect having a wire neck; and the protective dot to cover the interconnect on the first integrated circuit device having the peripheral bond pad further comprises:

the wire neck on the peripheral bond pad protected with the protective dot.

18. The system as claimed in claim 16 wherein the interconnect between the first integrated circuit device having the peripheral bond pad and the substrate includes the interconnect on the first integrated circuit device.

19. The system as claimed in claim 16 further comprising an additional protective dot as a spacer between the first integrated circuit device and the second integrated circuit device.

20. The system as claimed in claim 16 wherein the protective dot comprises an epoxy or a B-Stage material.

* * * * *